(12) United States Patent
Jung

(10) Patent No.: US 10,725,863 B2
(45) Date of Patent: Jul. 28, 2020

(54) MEMORY SYSTEM AND METHOD FOR OPERATING THE SAME

(71) Applicant: SK hynix Inc., Gyeonggi-do (KR)

(72) Inventor: Yong Il Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 62 days.

(21) Appl. No.: 16/032,515

(22) Filed: Jul. 11, 2018

(65) Prior Publication Data

US 2019/0138392 A1 May 9, 2019

(30) Foreign Application Priority Data

Nov. 7, 2017 (KR) .................. 10-2017-0147375

(51) Int. Cl.
| | |
|---|---|
| *G06F 11/10* | (2006.01) |
| *H03M 13/11* | (2006.01) |
| *G11C 11/4093* | (2006.01) |
| *G11C 8/10* | (2006.01) |
| *G11C 29/52* | (2006.01) |
| *G11C 11/56* | (2006.01) |
| *H03M 13/00* | (2006.01) |
| *H03M 13/37* | (2006.01) |

(Continued)

(52) U.S. Cl.
CPC ...... *G06F 11/1068* (2013.01); *G06F 11/1012* (2013.01); *G11C 8/10* (2013.01); *G11C 11/4093* (2013.01); *G11C 11/5642* (2013.01); *G11C 29/52* (2013.01); *H03M 13/1111* (2013.01); *H03M 13/3738* (2013.01); *H03M 13/3746* (2013.01); *H03M 13/6325* (2013.01); *G11C 16/26* (2013.01); *G11C 2029/0411* (2013.01); *H03M 13/1108* (2013.01); *H03M 13/3715* (2013.01)

(58) Field of Classification Search
CPC ............ G06F 11/1068; G06F 11/1072; G06F 11/1012; G06F 11/1048; H03M 13/3746; H03M 13/3738; H03M 13/1108; H03M 13/1111; H03M 13/6325; G11C 29/52; G11C 29/42; G11C 8/10; G11C 16/26
See application file for complete search history.

(56) References Cited

U.S. PATENT DOCUMENTS

| | | | | |
|---|---|---|---|---|
| 2013/0311711 | A1* | 11/2013 | Yang ................... | G06F 12/0246 711/103 |
| 2015/0227420 | A1* | 8/2015 | Oh ........................ | G11C 29/52 714/764 |

(Continued)

FOREIGN PATENT DOCUMENTS

KR 1020160109010 9/2016

*Primary Examiner* — Shelly A Chase
(74) *Attorney, Agent, or Firm* — IP & T Group LLP

(57) ABSTRACT

A memory system and a method for operating the memory system, in which the memory system includes a semiconductor memory device for storing data, and for reading and outputting the stored data in a read operation, and a controller controlling the semiconductor memory device in the read operation, and sequentially performing first and second decoding operations on the data output from the semiconductor memory device, wherein the controller updates and stores a bin label codeword in the second decoding operation, and backs up and stores a start bin label codeword in the bin label codeword.

23 Claims, 8 Drawing Sheets

(51) Int. Cl.
  *G11C 16/26* (2006.01)
  *G11C 29/04* (2006.01)

(56) References Cited

U.S. PATENT DOCUMENTS

2015/0331627 A1* 11/2015 Kwak .................. G11C 11/5628
                                                        711/103
2017/0168894 A1*  6/2017 Kim .................... G06F 11/1068

* cited by examiner

MEMORY SYSTEM AND METHOD FOR OPERATING THE SAME

CROSS-REFERENCE TO RELATED APPLICATION

The present application claims priority to Korean patent application number 10-2017-0147375, filed on Nov. 7, 2017, which is incorporated herein by reference in its entirety.

BACKGROUND

1. Field of Invention

Various embodiments of the present disclosure generally relate to a memory system including a nonvolatile memory device. Particularly, the embodiments relate to a memory system for performing an error correction operation and a method for operating the memory system.

2. Description of Related Art

The computer environment paradigm is shifting towards ubiquitous computing, which allows users to use computing systems anywhere and anytime. As a result, use of portable electronic devices such as mobile phones, digital cameras, laptop computers, and the like has increased rapidly. Such portable electronic devices may generally include a memory system using a memory device, i.e., a data storage device. The data storage device may be used as a main memory device or an auxiliary memory device of the portable electronic devices.

Such a data storage device has excellent stability and durability, high information access speed, and low power consumption, since the device has no mechanical driving part. Examples of memory systems having such advantages include a universal serial bus (USB) memory device, memory cards having various interfaces, a solid state drive (SSD), and the like.

SUMMARY

Embodiments provide a memory system capable of reducing the time required to perform data recovery in an ECC decoding operation and a method for operating the memory system.

According to an aspect of the present disclosure, there is provided a memory system including: a semiconductor memory device configured to store data, and read and output the stored data in a read operation; and a controller configured to control the semiconductor memory device in the read operation, and sequentially perform first and second decoding operations on the data output from the semiconductor memory device, wherein the controller updates and stores a bin label codeword in the second decoding operation, and backs up and stores a start bin label codeword in the bin label codeword.

According to an aspect of the present disclosure, there is provided a memory system including: a semiconductor memory device configured to store data, and read and output the stored data in a read operation; and a controller configured to perform a decoding operation on the data output from the semiconductor memory device, wherein the controller includes: an ECC unit configured to perform a soft decision decoding operation, and an additional soft decision decoding operation; and an ECC buffer configured to update and store a bin label codeword in the additional soft decision decoding operation, and back up and store a start bin label codeword in the bin label codeword.

According to an aspect of the present disclosure, there is provided a method for operating a memory system, the method including: performing a soft decision decoding operation; when it is determined that the soft decision decoding operation has failed, performing a first additional soft decision decoding operation, updating and storing a plurality of bin label codewords including a start bin label codeword, and backing up and storing the start bin label codeword; and when it is determined that the first additional soft decision decoding operation has failed, performing a second additional soft decision decoding operation, using the backed-up start bin label codeword.

According to an aspect of the present disclosure, there is provided a memory system including: a memory device; and a controller configured to: perform a first soft decision decoding operation to a codeword provided from the memory device according to a first group of soft read voltages in a first order; and perform a second soft decision decoding operation to the codeword according to a second group of soft read voltages in a second order when the first soft decision decoding operation fails, wherein the controller starts performing the first and second soft decision decoding operations to the codeword according to a predetermined soft read voltage.

BRIEF DESCRIPTION OF THE DRAWINGS

Embodiments will now be described more fully with reference to the accompanying drawings; however, elements and features of the present invention may be configured or arranged differently than shown or described herein, as will be apparent to those skilled in the art in light of this disclosure. Thus, the present invention is not limited to the embodiments set forth herein. Rather, these embodiments are provided so that this disclosure is thorough and complete and fully conveys the scope of the present invention to those skilled in the art. Moreover, reference to "an embodiment" does not necessarily mean only one embodiment, and different references to "an embodiment" are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, certain embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include one or more other components instead of excluding other component(s), unless stated or the context requires otherwise.

Figure 1:
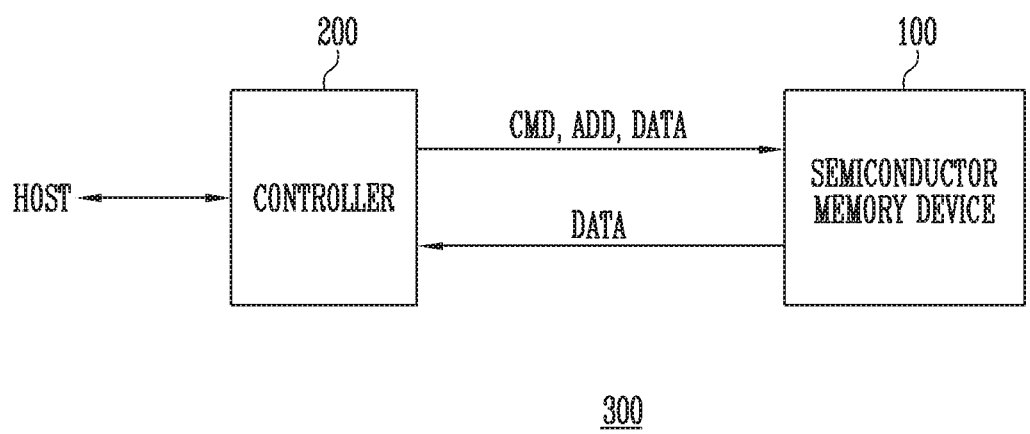
FIG. 1 is a block diagram illustrating a memory system according to an embodiment of the present disclosure.
Figure 2:
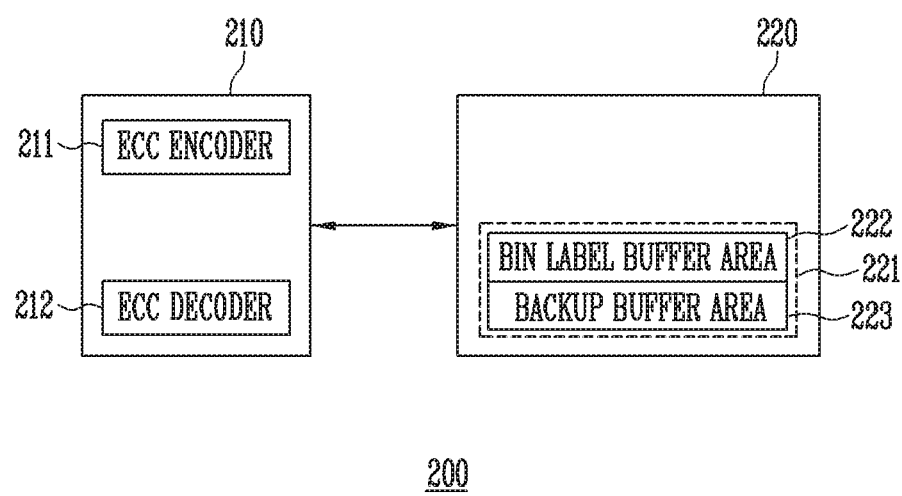
FIG. 2 is an exemplary block diagram illustrating a controller shown in FIG. 1.

FIG. 1 is a block diagram illustrating a memory system according to an embodiment of the present disclosure. FIG. 2 is an exemplary block diagram illustrating a controller shown in FIG. 1.

Referring to FIG. 1, the memory system 300 includes a semiconductor memory device 100 and a controller 200 for controlling an operation of the semiconductor memory device 100 in response to a request from a host.

The semiconductor memory device 100 performs a program operation or a read operation on memory cells of pages included in a memory block in response to a command CMD and an address ADD, which are received from the controller 200. The semiconductor memory device 100 programs data DATA input from the controller 200 to memory cells of a page to be programmed, and outputs data DATA read from the memory cells to the controller 200.

Referring to FIG. 2, the controller 200 includes an ECC unit 210 and a memory 220.

The ECC unit 210 may include an ECC encoder 211 and an ECC decoder 212.

The ECC encoder 211 may form data to which a parity bit is added by ECC encoding data to be programmed to the semiconductor memory device 100 of FIG. 1. The parity bit may be stored in the semiconductor memory device 100.

The ECC decoder 212 may perform ECC decoding on data read from the semiconductor memory device 100. The ECC decoder 212 may determine whether the ECC decoding has succeeded and output an instruction signal, based on the determined result. The ECC decoder 212 may correct an error bit of data, using a parity bit generated in an ECC encoding process.

If the number of error bits is equal to or greater than the threshold number of correctable error bits, the ECC unit 210 cannot correct the error bits. In this situation, an error correction fail signal may be generated.

The ECC unit 210 may perform error correction by using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation, and/or Hamming code, but the present disclosure is not limited to these techniques; any other suitable error correction technique may be used. Also, the ECC unit 210 may include a circuit, system, or device for error correction.

In an embodiment of the present disclosure, the ECC unit 210 may perform error bit correction, using hard decision data and soft decision data.

The memory 220 may store data read from the semiconductor memory device 100 or store data to be programmed to the semiconductor memory device 100. The memory 220 may be used as a working memory of the controller 200, a cache memory between the semiconductor memory device 100 and the host, and/or a buffer memory between the semiconductor memory device 100 and the host.

In an embodiment of the present disclosure, a partial area of the memory 220 may be used as an ECC buffer 221. The ECC buffer 221 may store a bin label codeword, a corrected codeword, and an original codeword.

The bin label codeword may include information obtained by discriminating threshold voltages of memory cells, which are acquired in a soft read operation for a soft decoding operation during an ECC decoding operation, based on read voltages. The corrected codeword is a codeword on which an ECC decoding process is completely performed. The original codeword is a codeword on which the ECC decoding process is not performed.

The ECC buffer 221 may include a bin label buffer area 222 and a backup buffer area 223. A bin label codeword may be stored in the bin label buffer area 222, and the backup buffer area 223 may copy and store the bin label codeword stored in the bin label buffer area 222.

For example, when the soft decoding operation is completed and an additional first soft decoding operation is performed during the ECC decoding operation, a start bin label codeword stored in the bin label buffer area 222 may be copied into the backup buffer area 223. When an additional second soft decoding operation is performed, the start bin label codeword stored in the backup buffer area 223 may be copied into the bin label buffer area 222.

Figure 3:
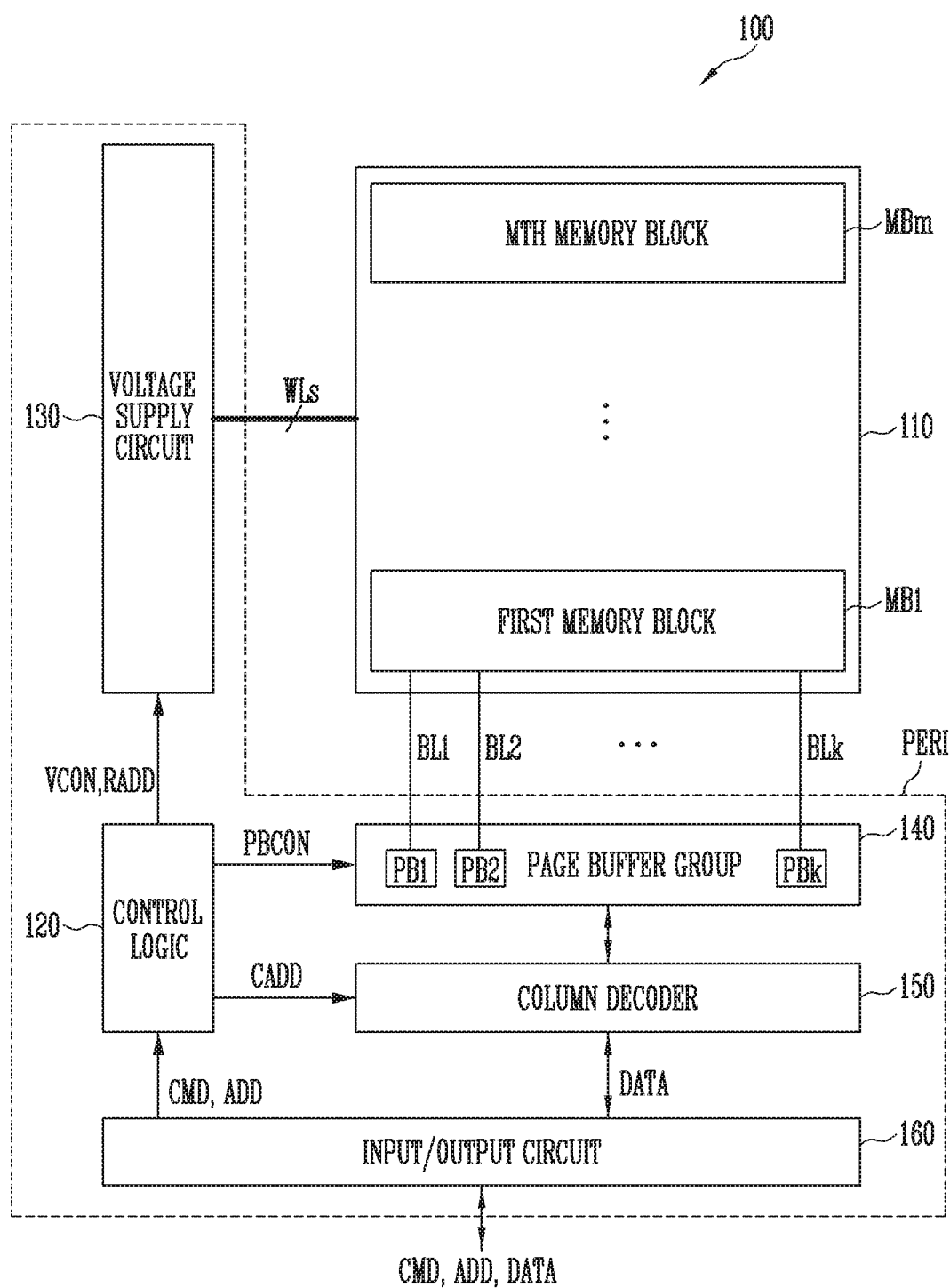
FIG. 3 is an exemplary block diagram illustrating a semiconductor memory device shown in FIG. 1.
Figure 4:
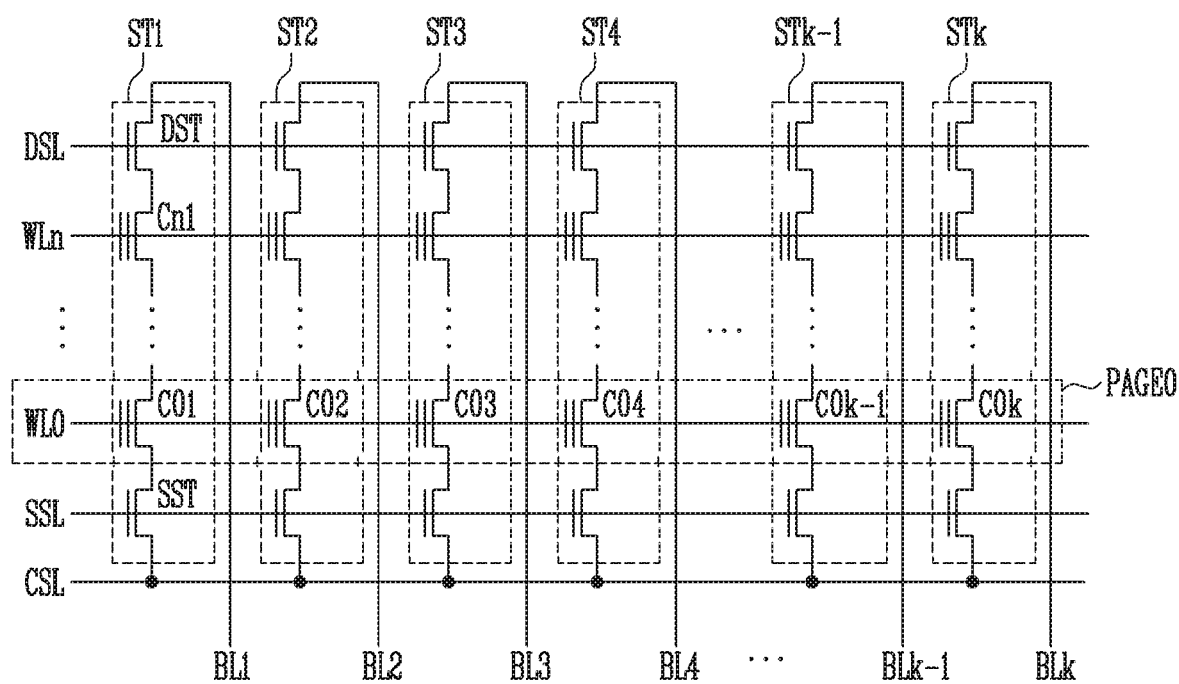
FIG. 4 is an exemplary circuit diagram illustrating a memory block shown in FIG. 3.

FIG. 3 is an exemplary block diagram illustrating the semiconductor memory device shown in FIG. 1. FIG. 4 is an exemplary circuit diagram illustrating a memory block shown in FIG. 3.

Referring to FIG. 3, the semiconductor memory device 100 according to the present disclosure includes a memory cell array 110 including first to mth memory blocks MB1 to MBm and a peripheral circuit PERI configured to perform a program operation and a read operation on memory cells included in a selected page of the memory blocks MB1 to MBm. The peripheral circuit PERI includes a control logic 120, a voltage supply circuit 130, a page buffer group 140, a column decoder 150, and an input/output circuit 160.

Referring to FIG. 4, each memory block includes a plurality of strings ST1 to STk coupled between bit lines BL1 to BLk and a common source line CSL. That is, the strings ST1 to STk are coupled to corresponding bit lines BL1 to BLk, respectively, and are commonly coupled to the common source line CSL. Each string ST1 includes a source select transistor SST having a source coupled to the common source line CSL, a plurality of memory cells C01 to Cn1, and a drain select transistor DST having a drain coupled to the bit line BL1. The memory cells C01 to Cn1 are coupled in series between the select transistors SST and DST. A gate of the source select transistor SST is coupled to a source select line SSL, gates of the memory cells C01 to Cn1 are coupled to word lines WL0 to WLn, respectively, and a gate of the drain select transistor DST is coupled to a drain select line DSL.

Memory cells included in a memory block may be divided in units of physical pages or logical pages. For example, the memory cells C01 to C0k coupled to one word line (e.g., WL0) constitute one physical page PAGE0. Such a page becomes a basic unit of the program operation or the read operation.

The control logic 120 outputs a voltage control signal VCON for generating a voltage required to perform a program operation or a read operation in response to a command CMD input through the input/output circuit 160, and outputs a PB control signal PBCON for controlling page buffers PB1 to PBk included in the page buffer group 140 according to the kind of an operation. Also, the control logic 120 outputs a row address signal RADD and a column address signal CADD in response to an address signal ADD input from the outside through the input/output circuit 160.

The voltage supply circuit 130 supplies operating voltages required to perform a program operation, a read operation, and an erase operation on memory cells in response to the voltage control signal VCON of the control logic 120 to local lines including the drain select line DSL, the word lines WL0 to WLn, and the source select line SSL of a selected memory block. The voltage supply circuit 130 includes a voltage generating circuit and a row decoder.

The voltage generating circuit outputs operating voltages required to perform a program operation, a read operation, or an erase operation of memory cells to global lines in response to the voltage control signal VCON of the control logic 120.

The row decoder connects the global lines to the local lines DSL, WL0 to WLn, and SSL such that the operating voltages output to the global lines by the voltage generating circuit can be transferred to the local lines DSL, WL0 to WLn, and SSL of a selected memory block in the memory cell array 110.

The page buffer group 140 includes a plurality of page buffers PB1 to PBk coupled to the memory cell array 110 respectively through the bit lines BL1 to BLk. The page buffers PB1 to PBk selectively precharge the bit lines BL1 to BLk according to input data so as to store data in the memory cells C01 to C0k in response to the PB control signal PBCON of the control logic 120, or sense voltages of the bit lines BL1 to BLk so as to read data from the memory cells C01 to C0k.

The column decoder 150 selects the page buffers PB1 to PBk in response to the column address signal CADD output from the control logic 120. That is, the column decoder 150 sequentially transfers data to be stored in the memory cells to the page buffers PB1 to PBk in response to the column address signal CADD. In addition, the column decoder 150 sequentially selects the page buffers PB1 to PBk in response to the column address signal CADD such that data of the memory cells, which are latched to the page buffers PB1 to PBk in a read operation can be output to the outside.

The input/output circuit 160 transfers data to the column decoder 150 under the control of the control logic 120 so as to input, to the page buffer group 140, data input from an external source that is to be stored in the memory cells in a program operation. If the column decoder 150 transfers the data transferred from the input/output circuit 160 to the page buffers PB1 to PBk, such page buffers store the input data in latch circuits thereof. In a read operation, the input/output circuit 160 outputs data transferred from the page buffers PB1 to PBk through the column decoder 150 to one or more external devices.

In a read operation, the semiconductor memory device 100 may output hard decision data through a hard decision read operation and output soft decision data through a soft decision read operation. A read voltage applied to the word lines in the hard decision read operation may be different from that applied to the word lines in the soft decision read operation.

Figure 5:
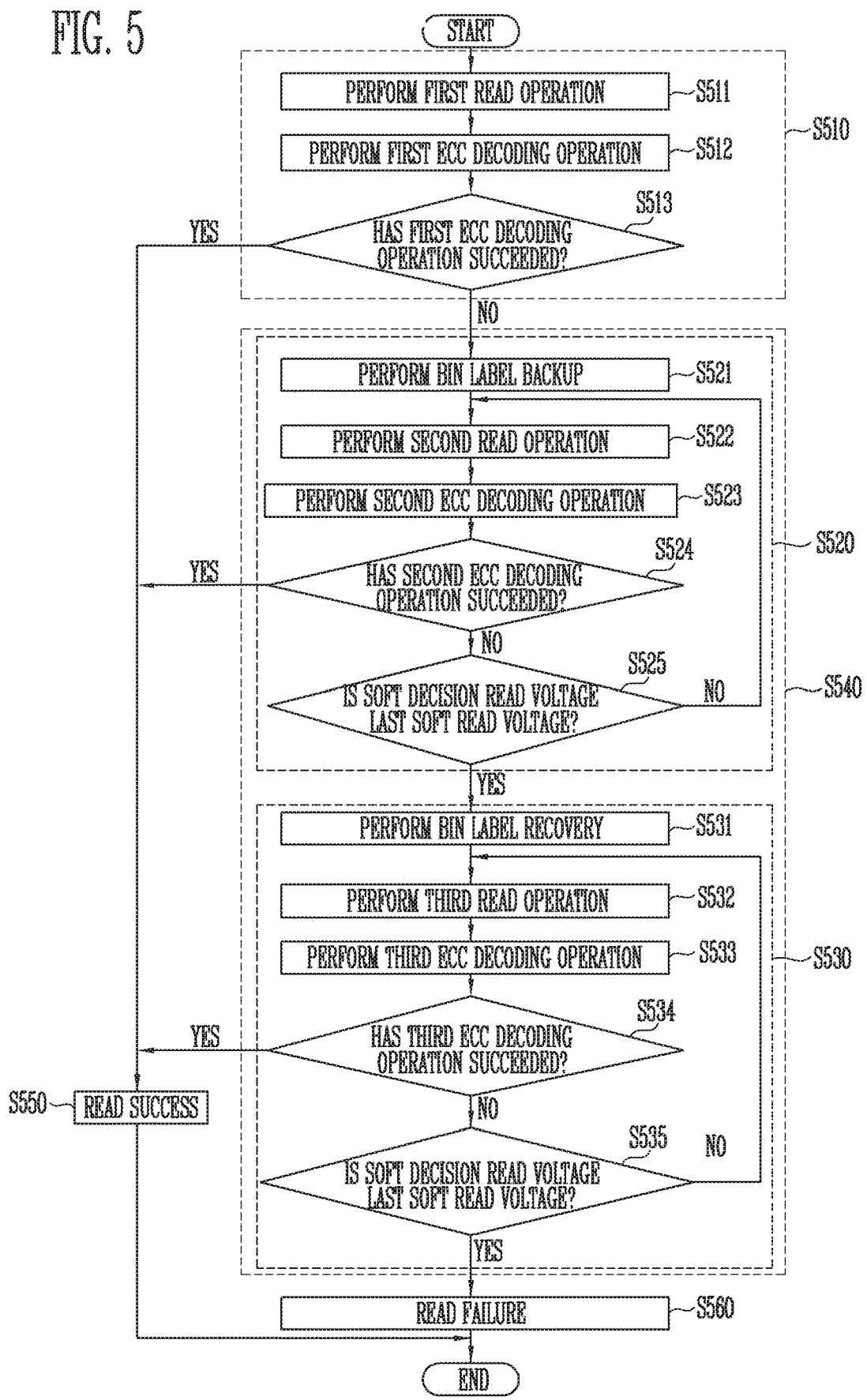
FIG. 5 is a flowchart describing a method for operating the memory system according to an embodiment of the present disclosure.
Figure 6:
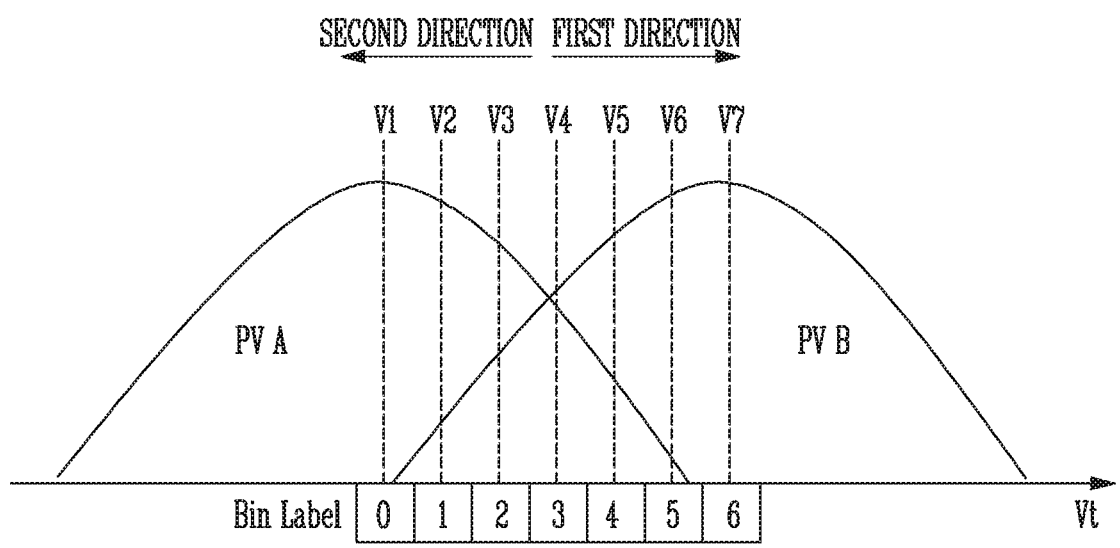
FIG. 6 is a threshold voltage distribution diagram illustrating the method for operating the memory system according to an embodiment of the present disclosure.

FIG. 5 is a flowchart describing a method for operating the memory system 300 according to an embodiment of the present disclosure. FIG. 6 is a threshold voltage distribution diagram illustrating the method for operating the memory system 300 according to an embodiment of the present disclosure.

The method for operating the memory system according to an embodiment of the present disclosure will be described with reference to FIGS. 1 to 6.

The method for operating the memory system 300 includes a first ECC decoding step (S510), and may be configured to perform a second ECC decoding step (S540) when the first ECC decoding step (S510) fails.

The first ECC decoding step (S510) may be a soft decision ECC decoding step. The first ECC decoding step (S510) may include steps S511 to S513.

The controller 200 controls the semiconductor memory device 100 to perform a first read operation at step S511.

The control logic 120 of the semiconductor memory device 100 outputs a voltage control signal VCON for generating voltages, e.g., a soft decision read voltage and a pass voltage, which are used to perform the first read operation, in response to a command CMD and an address ADD, which are received from the controller 200 through the input/output circuit 160. The voltage supply circuit 130 supplies the soft decision read voltage and the pass voltage to the word lines WLs (WL0 to WLn) of a selected memory block (e.g., MB1) in response to the voltage control signal VCON of the control logic 120.

The control logic 120 outputs a PB control signal PBCON for controlling the page buffers PB1 to PBk in the page buffer group 140 in response to the command CMD received from the controller 200. The page buffers PB1 to PBk sense soft decision data by sensing potential levels or current amounts of corresponding bit lines BL1 to BLk in response to the PB control signal PBCON. The sensed soft decision data DATA is output to the memory 220 through the column decoder 150 and the input/output circuit 160.

The ECC decoder 212 performs a first ECC decoding operation at step S512. The first ECC decoding operation may be a soft decision ECC decoding operation. The soft decision ECC decoding operation may be performed based on soft decision data read from the semiconductor memory device 100 at step S511.

Then, it is determined, at step S513, whether the first ECC decoding operation of step S512 has succeeded. That is, it is determined whether an error of the soft decision ECC decoded soft decision data has been corrected. For example, the ECC decoder 212 determines at step S513 whether an error of the soft decision ECC decoded soft decision data has been corrected, using the soft decision ECC decoded soft decision data and a parity check matrix. For example, when a matrix operation result of the soft decision ECC decoded soft decision data and the parity check matrix is a zero matrix, it may be determined that the soft decision ECC decoded soft decision data is correct or corrected data. On the other hand, when the operation result of the soft decision ECC decoded soft decision data and the parity check matrix is not the zero matrix('0'), it may be determined that the soft decision ECC decoded soft decision data is not correct or corrected data.

When it is determined that the first ECC decoding operation has succeeded ("Yes" at S513), it is determined that the read operation has succeeded at step S550.

When it is determined that the soft decision ECC decoding operation has failed ("No" at S513), the second ECC decoding step (S540) is performed. The second ECC decoding step (S540) may be an additional soft decision ECC decoding step. The second ECC decoding step (S540) may include a first additional soft decoding step (S520) and a second additional soft decoding step (S530).

In the first additional soft decoding step (S520), new soft decision data is read from the semiconductor memory device 100 by changing the soft decision read voltage, and a soft decision decoding operation is performed based on the new soft decision data. During the first additional soft decoding step S520, when it is determined that the soft decoding operation has failed, new soft decision data may be read from the semiconductor memory device 100 by changing the soft decision read voltage in a first direction, and the soft decision decoding operation may be re-performed. In this disclosure, changing the soft decision read voltage in a first direction means that the soft decision read voltage is increased step by step, whereas changing the soft decision read voltage in a second direction means that the soft decision read voltage is decreased step by step.

The first additional soft decoding step (S520) may include steps S521 to S525.

The controller 200 sets one (e.g., V4 of FIG. 6) of a plurality of soft decision read voltages (V1 to V7 of FIG. 6) as a start soft decision read voltage, and stores a bin label codeword (e.g., 3 of FIG. 6) corresponding to the set soft decision read voltage among bin label codewords (0 to 6 of FIG. 6), which respectively correspond to the soft decision read voltages (V1 to V7) in the bin label buffer area 222 of the ECC buffer 221. In addition, the bin label codeword (e.g., 3 of FIG. 6) stored in the bin label buffer area 222 is copied into the backup buffer area 223 at step S521. Accordingly, a bin label codeword (e.g., 3 of FIG. 6) corresponding to the start soft decision read voltage (e.g., V4 of FIG. 6) is stored in the backup buffer area 223. The plurality of soft decision read voltages (V1 to V7 of FIG. 6) are read voltages having voltage values between two adjacent program states PV A and PV B.

The controller 200 controls the semiconductor memory device 100 to perform a second read operation at step S522. The second read operation at step S522 may be performed similarly to the first read operation at step S511 by setting the soft decision read voltage as a new soft decision read voltage (e.g., V4). As the result of the second read operation, sensed soft decision data DATA is output to the memory 220 of the controller 200 through the column decoder 150 and the input/output circuit 160.

The ECC decoder 212 performs a second ECC decoding operation at step S523. The second ECC decoding operation may be a soft decision ECC decoding operation. The soft decision ECC decoding operation may be performed based on soft decision data read in the second read operation. The second ECC decoding operation is similar to the first ECC decoding operation, and therefore, further detailed description is omitted here.

After this, it is determined at step S524 whether the second ECC decoding operation of step S523 has succeeded. That is, it is determined whether an error of the soft decision ECC decoded soft decision data has been corrected.

When it is determined that the second ECC decoding operation has succeeded ("Yes" at S524), it is determined that the read operation has succeeded at step S550.

When it is determined that the second ECC decoding operation has failed ("No" at S524), it is checked at step S525 whether the current soft decision read voltage used in the second read operation at step S522 is the last soft read voltage. The last soft read voltage may be the last soft read voltage V7, which is highest among the plurality of soft decision read voltages V1 to V7, in the first direction. When it is determined that the current soft decision read voltage used in the second read operation at step S522 is not the last soft read voltage ("No" at S525), a new soft decision read voltage (e.g., V5) is set by increasing the soft decision read voltage (i.e., changing it in the first direction), and the first additional soft decoding step (S520) is repeated from the second read operation at step S522. In this case, a bin label codeword (e.g., 4 of FIG. 6) corresponding to the new soft decision read voltage (e.g., V5) is updated in the bin label buffer area 222.

When it is determined that the soft decision read voltage used in the second read operation at step S522 is the last soft read voltage ("Yes" at S525), the second additional soft decoding step (S530) is performed.

Like the first additional soft decoding step (S520, in the second additional soft decoding step (S530), new soft decision data is read from the semiconductor memory device 100 by changing the soft decision read voltage, and a soft decision decoding operation is performed based on the new soft decision data. During the second addition soft decoding step S530, when it is determined that the soft decoding operation has failed, new soft decision data may be read from the semiconductor memory device 100 by changing the soft decision read voltage in the second direction opposite to the first direction, and the soft decision decoding operation may be re-performed. As described above, changing the soft decision read voltage in the second direction means that the soft decision read voltage is decreased step by step.

The second additional soft decoding step (S530) may include steps S531 to S535.

The controller 200 recovers the start bin label codeword by copying the bin label codeword (e.g., 3 of FIG. 6) corresponding to the start soft decision read voltage (e.g., 4V) stored in the backup buffer area 223 back to the bin label buffer area 222 at step S531. Accordingly, in the second additional soft decoding step (S530), a read operation and a decoding operation can be skipped, which are performed by decreasing the read voltage (i.e., changing it in the second direction) from the last read voltage in the previously performed first additional soft decoding step (S520). The start soft decision read voltage (e.g., 4V) is set using the recovered start bin label codeword, and a read operation and a decoding operation can be performed, which are performed by decreasing the read voltage from the start soft decision read voltage (e.g., 4V). Accordingly, in the second additional soft decoding step (S530), the read operation and the decoding operation, which overlap with the first additional soft decoding step (S520), can be skipped, thereby reducing the operation time of the memory system.

The controller 200 controls the semiconductor memory device 100 to perform a third read operation at step S532. The third read operation at step S532 may be performed similarly to the second read operation at step S522 by setting the soft decision read voltage as a new soft decision read voltage (e.g., V4). As the result of the third read operation, sensed soft decision data DATA is output to the memory 220 of the controller 200 through the column decoder 150 and the input/output circuit 160.

The ECC decoder 212 performs a third ECC decoding operation at step S533. The third ECC decoding operation may be a soft decision ECC decoding operation. The soft decision ECC decoding operation may be performed based on soft decision data read in the third read operation. The third ECC decoding operation is similar to the first ECC decoding operation, and therefore, further detailed description is omitted here.

After this, it is determined at step S534 whether the third ECC decoding operation of step S533 has succeeded. That is, it is determined whether an error of the soft decision ECC decoded soft decision data has been corrected.

When it is determined that the third ECC decoding operation has succeeded ("Yes" at S534), it is determined that the read operation has succeeded at step S550.

When it is determined that the third ECC decoding operation has failed ("No" at S534), it is checked at step S535 whether the current soft decision read voltage used in the third read operation at step S532 is the last soft read voltage. The last soft read voltage may be the last soft read voltage V1, which is lowest among the plurality of soft decision read voltages V1 to V7. When it is determined that the current soft decision read voltage used in the second read operation at step S532 is not the last soft read voltage ("No" at S535), a new soft decision read voltage (e.g., V3) is set by decreasing the soft decision read voltage, and the second additional soft decoding step S530 is repeated from the third read operation at step S532. In this case, a bin label codeword (e.g., 2 of FIG. 6) corresponding to the new soft decision read voltage (e.g., V3) is updated in the bin label buffer area 222.

When it is determined that the soft decision read voltage used in the third read operation at step S532 is the last soft read voltage ("Yes" at S535), it is determined that the read operation has failed at step S560, and the method of operating the memory system is ended.

Figure 7:
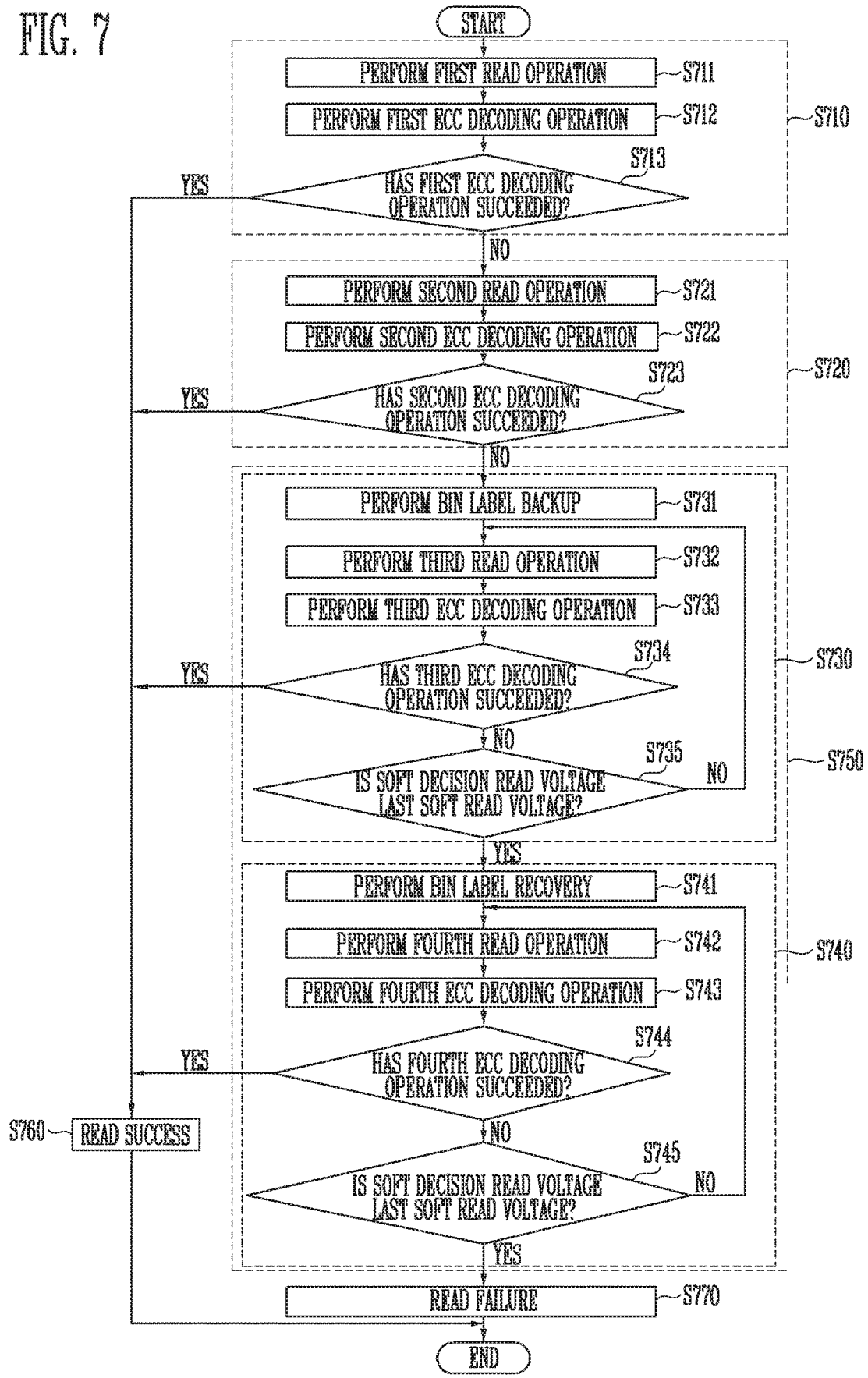
FIG. 7 is a flowchart describing a method for operating the memory system according to another embodiment of the present disclosure.

FIG. 7 is a flowchart describing a method for operating the memory system 300 according to another embodiment of the present disclosure.

The method for operating the memory system 300 according to the another embodiment of the present disclosure will be described with reference to FIGS. 1 to 4, 6, and 7.

The method for operating the memory system includes a first ECC decoding step (S710), and may be configured to perform a second ECC decoding step (S720) when the first ECC decoding step (S710) fails. In addition, the method for operating the memory system may perform a third ECC decoding step (S750) when the second ECC decoding step (S720) fails.

The first ECC decoding step (S710) may be a hard decision ECC decoding step. The first ECC decoding step (S710) may include steps S711 to S713.

The controller 200 controls the semiconductor memory device 100 to perform a first read operation at step S711.

The control logic 120 of the semiconductor memory device 100 outputs a voltage control signal VCON for generating voltages, e.g., a hard decision read voltage and a pass voltage, which are used to perform the first read operation, in response to a command CMD and an address ADD, which are received from the controller 200 through the input/output circuit 160. The voltage supply circuit 130 supplies the hard decision read voltage and the pass voltage to the word lines WLs (WL0 to WLn) of a selected memory block (e.g., MB1) in response to the voltage control signal VCON of the control logic 120.

The control logic 120 outputs a PB control signal PBCON for controlling the page buffers PB1 to PBk in the page buffer group 140 in response to the command CMD received from the controller 200. The page buffers PB1 to PBk sense hard decision data by sensing potential levels or current amounts of corresponding bit lines BL1 to BLk in response to the PB control signal PBCON. The sensed hard decision data DATA is output to the memory 220 through the column decoder 150 and the input/output circuit 160.

The ECC decoder 212 performs a first ECC decoding operation on the hard decision data DATA stored in the memory 220 at step S712. The first ECC decoding operation may be a hard decision ECC decoding operation.

After this, it is determined at step S713 whether the first ECC decoding operation of step S712 has succeeded. That is, it is determined whether an error of the hard decision ECC decoded hard decision data has been corrected at step S712. For example, the ECC decoder 212 determines at step S713 whether an error of the hard decision ECC decoded hard decision data has been corrected, using the hard decision ECC decoded hard decision data and a parity check matrix. For example, when a matrix operation result of the hard decision ECC decoded hard decision data and the parity check matrix is a zero matrix, it may be determined that the hard decision ECC decoded hard decision data is correct or corrected data. On the other hand, when the operation result of the hard decision ECC decoded hard decision data and the parity check matrix is not the zero matrix, it may be determined that the hard decision ECC decoded hard decision data is not correct or corrected data.

When it is determined that the first ECC decoding operation has succeeded ("Yes" at S713), it is determined that the read operation has succeeded at step S760. The hard decision ECC decoded hard decision data is an error-corrected data, and may be output to a device external to the memory controller 200 or be used within the memory controller 200.

When it is determined that the first ECC decoding operation has failed ("No" at S713), the second ECC decoding step (S720) is performed.

The second ECC decoding step (S720) may be a soft decision ECC decoding step. The second ECC decoding step (720) may include steps S721 to S723.

The controller 200 controls the semiconductor memory device 100 to perform a second read operation at step S721.

The control logic 120 of the semiconductor memory device 100 outputs a voltage control signal VCON for generating voltages, e.g., a soft decision read voltage and a pass voltage, which are used to perform the second read operation, in response to a command CMD and an address ADD, which are received from the controller 200 through the input/output circuit 160. The soft decision read voltage may be different from the hard decision read voltage used in the first read operation. The voltage supply circuit 130 supplies the soft decision read voltage and the pass voltage to the word lines WLs (WL0 to WLn) of a selected memory block (e.g., MB1) in response to the voltage control signal VCON of the control logic 120.

The control logic 120 outputs a PB control signal PBCON for controlling the page buffers PB1 to PBk in response to the command CMD received from the controller. The page buffers PB1 to PBk sense soft decision data by sensing potential levels or current amounts of corresponding bit lines BL1 to BLk in response to the PB control signal PBCON. The sensed soft decision data DATA is output to the memory 220 of the controller 200 through the column decoder 150 and the input/output circuit 160.

The ECC decoder 212 performs a second ECC decoding operation at step S722. The second ECC decoding operation may be a soft decision ECC decoding operation. The soft decision ECC decoding operation may be performed based on hard decision data read in the first ECC decoding operation and soft decision data read from the semiconductor memory device 100 at step S721.

Since the hard decision data and the soft decision data are data read using read voltages different from each other, i.e., a hard decision read voltage and a soft decision read voltage, the hard decision data and the soft decision data may have data values different from each other. If an additional read operation according to the soft decision read voltage is performed in addition to a read operation according to the hard decision read voltage, it is possible to acquire additional information on threshold voltages of the memory cells C01 to C0n, i.e., LLR (e.g., information on the cells) that is information that enables reliability to be added to the soft decision data read by the second read operation.

If the additional information is acquired, it is possible to increase the probability or likelihood ratio that data stored in the memory cells C01 to C0n will be a first state (e.g., '1') or a second state (e.g., '0'). That is, it is possible to improve the reliability of a decoding operation.

After this, it is determined at step S723 whether the second ECC decoding operation of step S722 has succeeded. That is, it is determined whether an error of the soft decision ECC decoded soft decision data has been corrected at step S722. For example, the ECC decoder 212 determines at step S723 whether an error of the soft decision ECC decoded soft decision data has been corrected, using the soft decision ECC decoded soft decision data and a parity check matrix. For example, when a matrix operation result of the soft decision ECC decoded soft decision data and the parity check matrix is a zero matrix, it may be determined that the soft decision ECC decoded soft decision data is correct or corrected data. On the other hand, when the operation result of the soft decision ECC decoded soft decision data and the parity check matrix is not the zero matrix, it may be determined that the soft decision ECC decoded soft decision data is not correct or corrected data.

When it is determined that the second ECC decoding operation has succeeded ("Yes" at S723), it is determined that the read operation has succeeded at step S760.

When it is determined that the soft decision ECC decoding operation has failed ("No" at S723), the third ECC decoding step (S750) is performed. The third ECC decoding step (S750) may be an additional soft decision ECC decoding step. The third ECC decoding step (S750) may include a first additional soft decoding step (S730) and a second additional soft decoding step (S740).

In the first addition soft decoding step (S730), new soft decision data is read from the semiconductor memory device 100 by changing the soft decision read voltage, and a soft decision decoding operation is performed based on the hard decision data and the new soft decision data. During the first addition soft decoding step S730, when it is determined that the decoding operation has failed, new soft decision data may be read from the semiconductor memory device 100 by changing the soft decision read voltage in a first direction, and the soft decision decoding operation may be re-performed. In this disclosure, changing the soft decision read voltage in the first direction means that the soft decision read voltage is increased step by step, whereas changing the soft decision read voltage in a second direction means that the soft decision read voltage is decreased step by step.

The first additional soft decoding step (S730) may include steps S731 to S735.

The controller 200 sets one (e.g., V4 of FIG. 6) of a plurality of soft decision read voltages (V1 to V7 of FIG. 6) as a start soft decision read voltage, and stores a bin label codeword (e.g., 3 of FIG. 6) corresponding to the set soft decision read voltage among bin label codewords (0 to 6 of FIG. 6), which respectively correspond to the plurality of soft decision read voltages (V1 to V7 of FIG. 6) in the bin label buffer area 222 of the ECC buffer 221. In addition, the bin label codeword stored in the bin label buffer area 222 is copied into the backup buffer area 223 at step S731. Accordingly, a bin label codeword (e.g., 3 of FIG. 6) corresponding to the start soft decision read voltage (e.g., V4 of FIG. 6) is stored in the backup buffer area 223. The plurality of soft decision read voltages (V1 to V7 of FIG. 6) are read voltages having voltage values between two adjacent program states PV A and PV B.

The controller 200 controls the semiconductor memory device 100 to perform a third read operation at step S732. The third read operation at step S732 may be performed similarly to the second read operation at step S721 by setting the soft decision read voltage as a new soft decision read voltage (e.g., V4). As the result of the third read operation, sensed soft decision data DATA is output to the memory 220 through the column decoder 150 and the input/output circuit 160.

The ECC decoder 212 performs a third ECC decoding operation at step S733. The third ECC decoding operation may be a soft decision ECC decoding operation. The soft decision ECC decoding operation may be performed based on the hard decision data read in the first ECC decoding operation and the soft decision data read in the third read operation. The third ECC decoding operation is similar to the second ECC decoding operation, and therefore, further detailed description is omitted.

After this, it is determined at step S734 whether the third ECC decoding operation has succeeded. That is, it is determined whether an error of the soft decision ECC decoded soft decision data has been corrected.

When it is determined that the third ECC decoding operation has succeeded ("Yes" at S734), it is determined that the read operation has succeeded at step S760.

When it is determined that the third ECC decoding operation has failed ("No" at S734), it is checked at step S735 whether the current soft decision read voltage used in the third read operation at step S732 is the last soft read voltage. The last soft read voltage may be the last soft read voltage V7, which is highest among the plurality of soft decision read voltages V1 to V7, in the first direction. When it is determined that the current soft decision read voltage used in the third read operation at step S732 is not the last soft read voltage ("No" at S735), a new soft decision read voltage (e.g., V5) is set by increasing the soft decision read voltage, and the first additional soft decoding step (S730) is repeated from the third read operation at step S732. In this case, a bin label codeword (e.g., 4 of FIG. 6) corresponding to the new soft decision read voltage (e.g., V5) is updated in the bin label buffer area 222.

When it is determined that the soft decision read voltage used in the third read operation at step S732 is the last soft read voltage ("Yes" at S735), the second additional soft decoding step (S740) is performed.

Like the first additional soft decoding step (S730), in the second additional soft decoding step (S740), new soft decision data is read from the semiconductor memory device 100 by changing the soft decision read voltage, and a soft decision decoding operation is performed based on the hard decision data and the new soft decision data. During the second addition soft decoding step S740, when it is determined that the soft decoding operation has failed, new soft decision data may be read from the semiconductor memory device 100 by changing the soft decision read voltage in the second direction that is opposite to the first direction, and the soft decision decoding operation may be re-performed. As described above, changing the soft decision read voltage in the second direction means that the soft decision read voltage is decreased step by step.

The second additional soft decoding step (S740) may include steps S741 to S745.

The controller 200 recovers the start bin label codeword by copying the bin label codeword (e.g., 3 of FIG. 6) corresponding to the start soft decision read voltage (e.g., 4V) stored in the backup buffer area 223 back to the bin label buffer area 222 at step S741. Accordingly, in the second additional soft decoding step (S740), a read operation and a decoding operation can be skipped, which are performed by decreasing the read voltage from the last read voltage in the previously performed first additional soft decoding step (S730). The start soft decision read voltage (e.g., 4V) is set using the recovered start bin label codeword, and a read operation and a decoding operation can be performed, which are performed by decreasing the read voltage from the start soft decision read voltage (e.g., 4V). Accordingly, in the second additional soft decoding step (S740), the read operation and the decoding operation, which overlap with the first additional soft decoding step (S730), can be skipped, thereby reducing the operation time of the memory system.

The controller 200 controls the semiconductor memory device 100 to perform a fourth read operation at step S742. The fourth read operation at step S742 may be performed similarly to the second read operation at step S721 by setting the soft decision read voltage as a new soft decision read voltage (e.g., V4). As the result of the fourth read operation, sensed soft decision data DATA is output to the memory 220 of the controller 200 through the column decoder 150 and the input/output circuit 160.

The ECC decoder 212 performs a fourth ECC decoding operation at step S743. The fourth ECC decoding operation may be a soft decision ECC decoding operation. The soft decision ECC decoding operation may be performed based on the hard decision data read in the first ECC decoding operation and soft decision data read in the fourth read operation. The fourth ECC decoding operation is similar to the second ECC decoding operation, and therefore, further detailed description is omitted.

After this, it is determined at step S744 whether the fourth ECC decoding operation of step S743 has succeeded. That is, it is determined whether an error of the soft decision ECC decoded soft decision data has been corrected.

When it is determined that the fourth ECC decoding operation has succeeded ("Yes" at S744), it is determined that the read operation has succeeded at step S760.

When it is determined that the fourth ECC decoding operation has failed ("No" at S744), it is checked at step S745 whether the current soft decision read voltage used in the fourth read operation at step S742 is the last soft read voltage. The last soft read voltage may be the last soft read voltage V1, which is lowest among the plurality of soft decision read voltages V1 to V7, in the second direction. When it is determined that the current soft decision read voltage used in the fourth read operation at step S742 is not the last soft read voltage ("No" at S745), a new soft decision read voltage (e.g., V3) is set by decreasing the soft decision read voltage, and the second additional soft decoding step (S740) is repeated from the fourth read operation at step S742. In this case, a bin label codeword (e.g., 2 of FIG. 6) corresponding to the new soft decision read voltage (e.g., V3) is updated in the bin label buffer area 222.

When it is determined that the soft decision read voltage used in the fourth read operation at step S742 is the last soft read voltage ("Yes" at S745), it is determined that the read operation has failed at step S770, and the method of operating the memory system is ended.

As described above, according to embodiments of the present disclosure, a hard decision decoding operation is performed before a soft decision decoding operation. However, the present disclosure is not limited thereto, and the soft decision decoding operation may be performed without the hard decision decoding operation. In addition, the hard decision decoding operation may be performed after the soft decision decoding operation and an additional soft decision decoding operation are performed.

Figure 8:
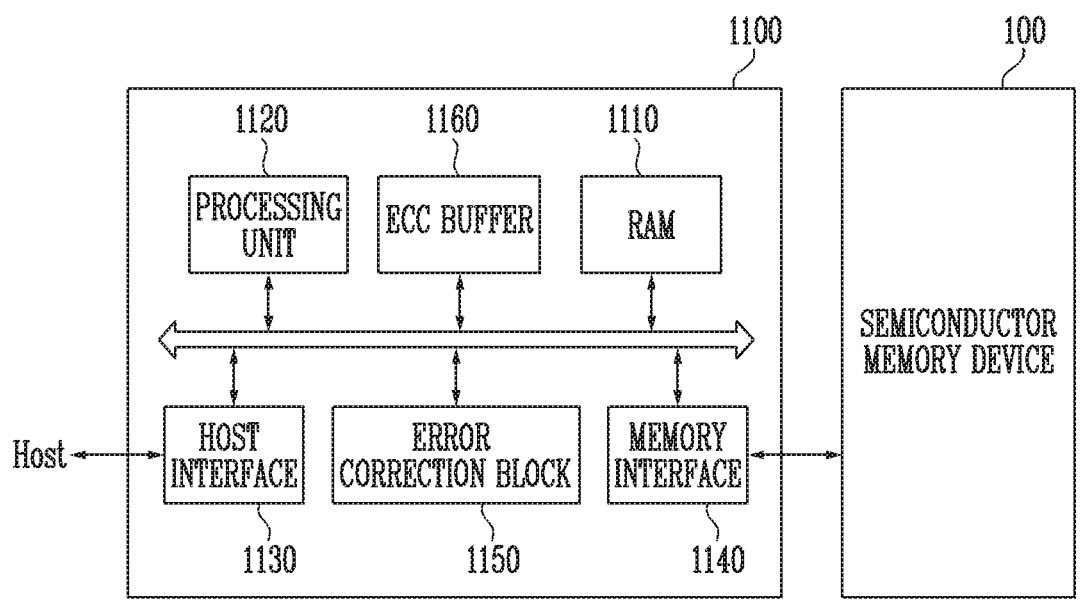
FIG. 8 is a block diagram illustrating another embodiment of the memory system.

FIG. 8 is a block diagram illustrating another embodiment of the memory system.

Referring to FIG. 8, the memory system 1000 includes a semiconductor memory device 100 and the controller 1100.

The semiconductor memory device 100 may be configured and operated identically to the semiconductor memory device described with reference to FIGS. 1 and 3. Thus, overlapping description is omitted.

The controller 1100 is coupled to a host (Host) and the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host. The controller 1100 is configured to drive firmware for controlling the semiconductor memory device 100.

The controller 1100 includes a random access memory (RAM) 1110, a processing unit 1120, a host interface 1130, a memory interface 1140, an error correction block 1150, and an ECC buffer 1160.

The RAM 1110 is used as at least one of a working memory of the processing unit 1120, a cache memory between the semiconductor memory device 100 and the host, and a buffer memory between the semiconductor memory device 100 and the host.

The processing unit 1120 controls overall operations of the controller 1100.

The host interface 1130 includes a protocol for exchanging data between the host and the controller 1100. In an embodiment, the controller 1100 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol. The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. In an embodiment, the error correction block 1150 may be provided as a component of the controller 1100. The error correction block 1150 may be a component corresponding to the ECC unit 210 of FIG. 2.

The ECC buffer 1160 may store a bin label codeword in a decoding operation of the error correction block 1150. The ECC buffer 1160 may back up and store a start bin label codeword, and recover the start bin label codeword, using the backed-up start bin label codeword in a new soft decoding operation. The ECC buffer 1160 may be a component corresponding to the ECC buffer 221 of FIG. 2.

The controller 1100 and the semiconductor memory device 100 may be integrated into a single semiconductor device. In an embodiment, the controller 1100 and the semiconductor memory device 100 may be so integrated to constitute a memory card, such as a PC card (personal computer memory card international association (PCM-CIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into a single semiconductor device to constitute a semiconductor drive (solid state drive (SSD)), which includes a storage device configured to store data in a semiconductor memory. If the memory system 1000 is used as the semiconductor drive SSD, the operating speed of the host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms, such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 9:
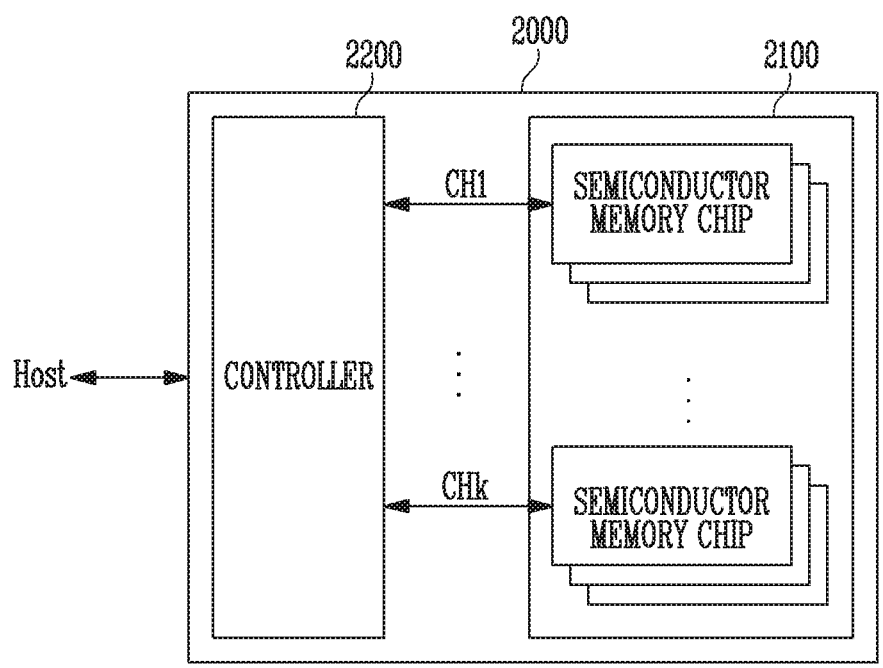
FIG. 9 is a block diagram illustrating an application example of the memory system of FIG. 8.

FIG. 9 is a block diagram illustrating an application example of the memory system of FIG. 8.

Referring to FIG. 9, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 9, the plurality of groups communicate with the controller 2200 through first to kth channels CH1 to CHk. Each semiconductor memory chip may be configured and operated identically to the semiconductor memory device 100 described with reference to FIGS. 1 and 3.

Each group is configured to communicate with the controller 2200 through one common channel. The controller 2200 is configured similarly to the controller 1100 described with reference to FIG. 8. The controller 2200 is configured to control the plurality of memory chips of the semiconductor memory device 2100 through the plurality of channels CH1 to CHk.

Figure 10:
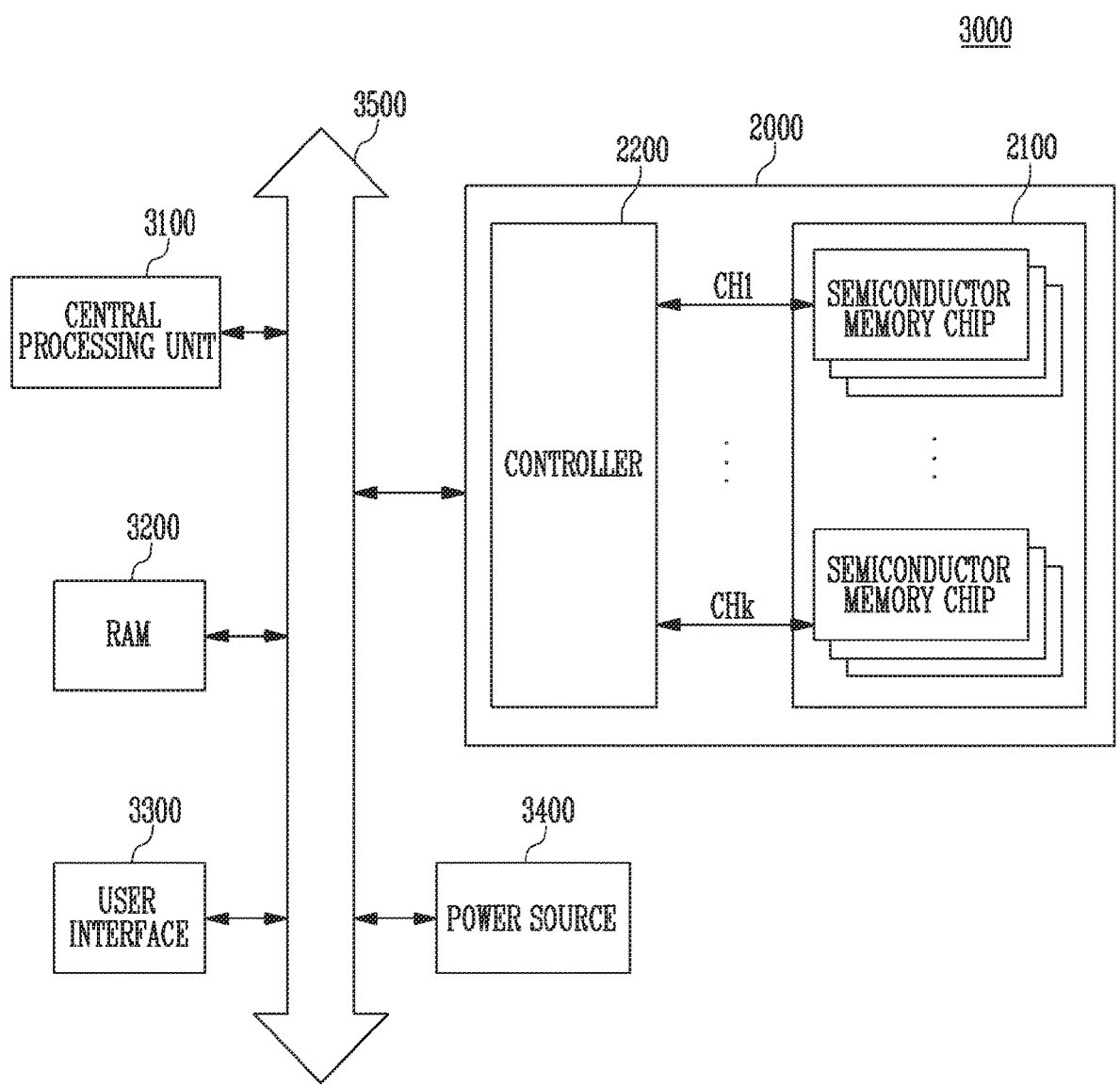
FIG. 10 is an exemplary block diagram illustrating a computing system including the memory system described with reference to FIG. 9.

FIG. 10 is a block diagram illustrating a computing system including the memory system described with reference to FIG. 9.

Referring to FIG. 10, the computing system 3000 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 10, the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 10, the memory system 2000 described with reference to FIG. 9 is illustrated. However, the memory system 2000 may be replaced by the memory system 1000 described with reference to FIG. 8. In an embodiment, the computing system 3000 may be configured to include both the memory systems 1000 and 2000 described with reference to FIGS. 8 and 9.

According to the present disclosure, in ECC decoding of the memory system, information on a soft decision read operation is stored as 20o a bin label codeword and then used in a subsequent soft decision read operation, so that it is possible to reduce the time required to perform an additional soft read operation, thereby improving a data recovery operation.

Embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a semiconductor memory device configured to store data, and read and output the stored data in a read operation; and
a controller configured to control the semiconductor memory device in the read operation, and sequentially perform first and second decoding operations on the data output from the semiconductor memory device,
wherein the controller updates and stores a bin label codeword in the second decoding operation, and backs up and stores a start bin label codeword in the bin label codeword.

2. The memory system of claim 1, wherein the first decoding operation is a soft decision decoding operation.

3. The memory system of claim 1, wherein the semiconductor memory device performs a read operation using a soft decision read voltage in the first decoding operation.

4. The memory system of claim 1, wherein the second decoding operation includes a first additional soft decoding operation and a second additional soft decoding operation.

5. The memory system of claim 4, wherein the semiconductor memory device:
performs at least one read operation using a new read voltage changed in a first direction from a start read voltage in the first additional soft decoding operation; and
performs at least one read operation using a new read voltage changed in a second direction from the start read voltage in the second additional soft decoding operation.

6. The memory system of claim 5, wherein the controller includes:
an ECC unit configured to perform the first and second decoding operations; and
an ECC buffer configured to update and store the bin label codeword corresponding to the start read voltage and the new read voltage changed in the first direction in the first additional soft decoding operation, and back up and store the start bin label codeword corresponding to the start read voltage.

7. The memory system of claim 6, wherein the ECC buffer includes:
a bin label buffer configured to update and store the bin label codeword; and
a backup buffer configured to back up the start bin label codeword in the read operation using the start read voltage during the first additional soft decoding operation.

8. The memory system of claim 7, wherein the backup buffer moves the start bin label codeword stored in the second additional soft decoding operation to the bin label buffer.

9. The memory system of claim 8, wherein the controller controls the semiconductor memory device to perform at least one read operation using the new read voltage changed in the second direction from the start read voltage, based on the start bin label codeword stored in the bin label buffer in the second additional soft decoding operation.

10. The memory system of claim 1, wherein the bin label codeword is obtained by dividing threshold voltages of memory cells, which are acquired in a read operation during the second decoding operation, based on read voltages.

11. The memory system of claim 1, wherein the controller performs a hard decision decoding operation before performing the first decoding operation.

12. A memory system comprising:
a semiconductor memory device configured to store data, and read and output the stored data in a read operation; and
a controller configured to perform a decoding operation on the data output from the semiconductor memory device,
wherein the controller includes:
an ECC unit configured to perform a soft decision decoding operation, and an additional soft decision decoding operation; and
an ECC buffer configured to update and store a bin label codeword in the additional soft decision decoding operation, and back up and store a start bin label codeword in the bin label codeword.

13. The memory system of claim 12, wherein the semiconductor memory device performs a first read operation using a soft decision read voltage in the soft decision decoding operation.

14. The memory system of claim 12, wherein the semiconductor memory device:
performs at least one second read operation using a new read voltage changed in a first direction from a start read voltage in a first additional soft decoding operation during the additional soft decision decoding operation; and
performs at least one third read operation using a new read voltage changed in a second direction from the start read voltage in a second additional soft decoding operation performed after the first additional soft decoding operation.

15. The memory system of claim 14, wherein the ECC buffer includes:
a bin label buffer configured to update and store the bin label codeword; and
a backup buffer configured to back up the start bin label codeword in the read operation using the start read voltage during the first additional soft decoding operation.

16. The memory system of claim 15, wherein the backup buffer moves the start bin label codeword stored in the second additional soft decoding operation to the bin label buffer.

17. The memory system of claim 16, wherein the controller controls the semiconductor memory device to perform at least one read operation using the new read voltage decreased in the second direction from the start read voltage, based on the start bin label codeword stored in the bin label buffer in the second additional soft decoding operation.

18. The memory system of claim 12, wherein the ECC unit performs a hard decision decoding operation before performing the soft decision decoding operation.

19. A method for operating a memory system, the method comprising:
performing a soft decision decoding operation;
when it is determined that the soft decision decoding operation has failed, performing a first additional soft decision decoding operation, updating and storing a plurality of bin label codewords including a start bin label codeword, and backing up and storing the start bin label codeword; and
when it is determined that the first additional soft decision decoding operation has failed, performing a second additional soft decision decoding operation, using the backed-up start bin label codeword.

20. The method of claim 19, further comprising performing a hard decision decoding operation before performing the soft decision decoding operation.

21. The method of claim 20, wherein, in the first additional soft decision decoding operation, soft decision data are read by performing at least one read operation using a new read voltage changed in a first direction from a start read voltage, and a soft decision decoding operation is performed based on the read soft decision data and hard decision data decoded in the hard decision decoding operation.

22. The method of claim 20, wherein, in the second additional soft decision decoding operation, soft decision data are read by performing at least one read operation using a new read voltage changed in a second direction from the start read voltage, and a soft decision decoding operation is performed based on the read soft decision data and hard decision data decoded in the hard decision decoding operation.

23. The method of claim 22, wherein, in the second additional soft decision decoding operation, the start read voltage is set using the backed-up start bin label codeword.

* * * * *